(12) United States Patent
Hashimoto

(10) Patent No.: US 6,654,302 B2
(45) Date of Patent: Nov. 25, 2003

(54) SEMICONDUCTOR MEMORY DEVICE WITH A SELF REFRESH MODE

(75) Inventor: Hiroaki Hashimoto, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/051,343

(22) Filed: Jan. 18, 2002

(65) Prior Publication Data

US 2002/0097625 A1 Jul. 25, 2002

(30) Foreign Application Priority Data

Jan. 22, 2001 (JP) .......................... 2001-013865

(51) Int. Cl.$^7$ ............................................. G11C 7/00
(52) U.S. Cl. ................................. 365/222; 365/233
(58) Field of Search ..................... 365/222, 233, 365/236, 189.01

(56) References Cited

U.S. PATENT DOCUMENTS 5,515,331 A * 5/1996 Kim .......................... 365/222
5,583,818 A * 12/1996 You et al. ................... 365/222
6,141,279 A * 10/2000 Hur et al. ................... 365/222

FOREIGN PATENT DOCUMENTS

JP          7-65574         3/1995
JP          10-125059       5/1998

OTHER PUBLICATIONS

English Bibliographies and Abstracts of JP 7–65574 and JP 10–125059 (noted above).

* cited by examiner

Primary Examiner—Anh Phung
(74) Attorney, Agent, or Firm—Darryl G. Walker; Bradley T. Sako (57) ABSTRACT

A semiconductor memory device having a self refresh mode may enter the self refresh mode in response to a self refresh set command and may be released from the self-refresh mode in response to a self refresh release command. The self refresh release command may include a plurality of self refresh release commands sequentially executed while a clock enable signal (CKE) is in a clock enable state. In this way, noise on a clock enable signal may not erroneously release the self refresh mode and the reliability of the self refresh mode may be improved.

20 Claims, 5 Drawing Sheets

SEMICONDUCTOR MEMORY DEVICE WITH A SELF REFRESH MODE

TECHNICAL FIELD

The present invention relates generally to a semiconductor memory device and more specifically to a semiconductor memory device, such as a DRAM (dynamic random access memory) having a self refresh mode and an externally applied exit command.

BACKGROUND OF THE INVENTION

A dynamic random access memory (DRAM) includes memory cells for storing data. In order to prevent data loss, the memory cells must be refreshed within a specified time period. One mode of operation of a DRAM is a self refresh mode. When a self refresh mode command is executed, data stored in the memory cells is automatically refreshed while the DRAM is in a standby state. In the standby state, the system (such as a computer system in which the DRAM is included) may be excluded from accessing the DRAM. During the operation of the self refresh mode, the system is not reading from or writing data to the DRAM, thus, it is desirable to reduce power consumption by disabling unused circuitry on the DRAM.

Figure 3:
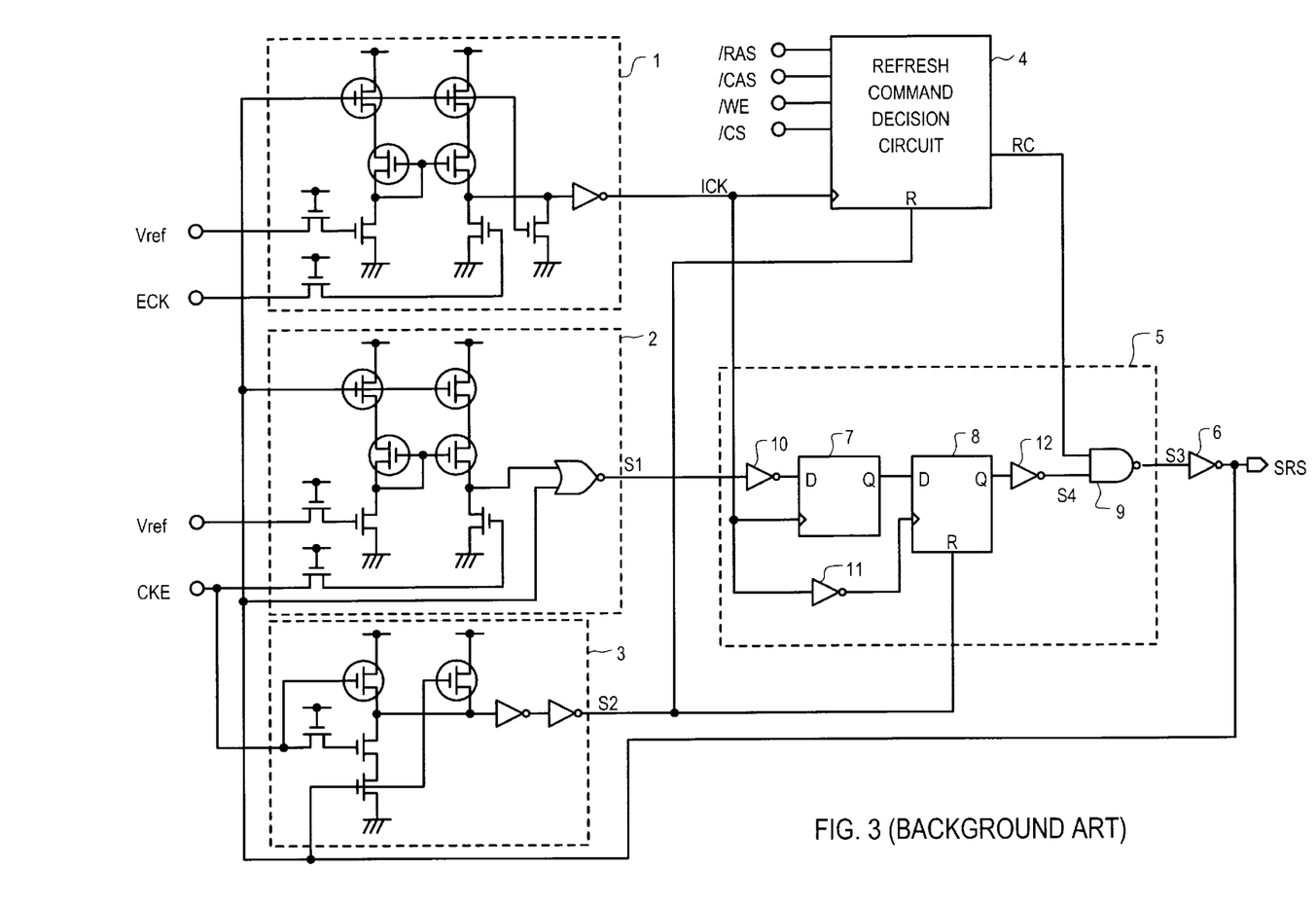
FIG. 3 is a circuit schematic diagram of a portion of a conventional semiconductor memory device.

Referring now to FIG. 3, a circuit schematic diagram of a portion of a conventional semiconductor memory device is set forth. The portion of a conventional semiconductor device of FIG. 3 is disclosed in Japanese Laid-Open Patent Publication No. Hei-7-65574 (JP 07065574 A). The conventional semiconductor device is a synchronous DRAM.

The portion of a conventional semiconductor memory device includes initial stage circuits (1 to 3), refresh command decision circuit 4, self refresh mode decision circuit 5 and an inverter 6.

Initial stage decision circuit 1 receives a self refresh latch signal SRS, a reference voltage Vref and an external clock ECK and provides an internal clock ICLK. Initial stage decision circuit 2 receives self refresh latch signal SRS, reference voltage Vref and a clock enable signal CKE and provides signal S1. Initial stage decision circuit 3 receives self refresh latch signal SRS, clock enable signal CKE and provides signal S2. Refresh command decision circuit 4 receives internal clock ICLK and external signals (/RAS, /CAS, /WE, and /CS) and provides a refresh command signal RC. Self refresh mode decision circuit 5 receives internal clock ICK, signal S1, and signal S2 and provides a signal S3. Inverter 6 receives signal S3 and provides self refresh latch signal SRS.

Initial stage circuit 1 includes a current mirror type receiver and is enabled when self refresh status latch signal SRS is at a low logic level. The initial stage circuit 1 outputs internal clock ICK. Internal clock ICK is a clock used in the conventional semiconductor memory device and is derived from external clock ECK. External clock ECK is a reference clock provided on the system.

Initial stage circuit 2 includes a current mirror type receiver and is enabled when self refresh status latch signal SRS is at the low logic level. Initial stage circuit 2 detects the logic level of clock enable signal CKE. The logic level of clock enable signal CKE determines whether or not external clock signal ECK is valid. When clock enable signal CKE is high and refresh status latch is low, initial stage circuit 2 provides signal S1 having a high level. However, when clock enable signal CKE is low, initial stage circuit 2 provides signal S1 having a low level.

Initial stage circuit 3 includes a complementary logic gate and is enabled when self refresh status latch is at the high logic level. Initial stage circuit 3 detects the release (exit) of the self refresh mode. The self refresh mode is exited when clock enable signal CKE transitions from the low logic level to the high logic level. In this case, initial stage circuit 3 provides signal S2 having a low level.

Refresh command decision circuit 4 detects an externally applied refresh command. The refresh command is provided by a low level row address strobe signal /RAS, a low level column address strobe signal /CAS, a low level chip select signal /CE, and a high level write enable signal /WE in synchronism with the rising edge of internal clock ICLK. Prefix "/" indicates negative logic. When a refresh command is detected, refresh command decision circuit 4 provides a refresh command signal RC having a high logic level.

Self refresh mode decision circuit 5 includes D-type flip-flop 7, D-type latch 8, NAND gate 9, and inverters (10, 11, and 12). When the refresh command signal RC indicates a refresh entry (set) to the self refresh mode, self refresh mode decision circuit 5 outputs signal S3 having a low logic level. Inverter 6 receives the low signal S3 and outputs self refresh latch signal SRS having a high logic level.

Figure 4:
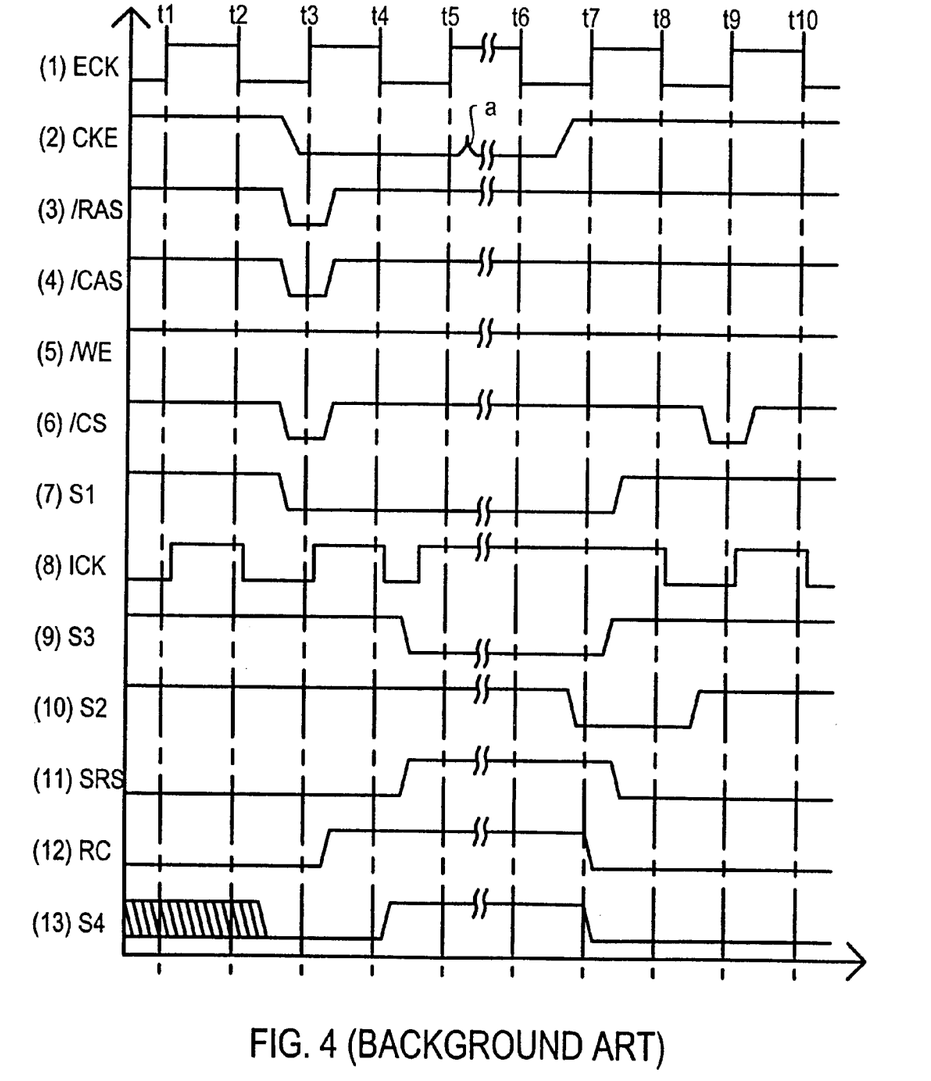
FIG. 4 is a timing diagram illustrating a conventional self refresh operation.

Referring now to FIG. 4, a timing diagram illustrating a conventional self refresh operation is set forth. The operation of the portion of the semiconductor memory device will now be described with reference to FIG. 4 in conjunction with FIG. 3.

Clock enable signal CKE is initially high before time t1 and transitions low at time t3. Also, because a refresh entry to the self refresh mode has not been executed, refresh command signal RC is low before time t3. Because refresh command signal RC is low, NAND gate 9 provides a high output as signal S3 from self refresh mode decision circuit 5. With signal S3 at the high level, inverter 6 provides a low output as self refresh latch signal SRS.

With self refresh latch signal SRS low, initial stage circuits (1 and 2) are in an enabled state and initial stage circuit 3 is in a disabled state. In this way, initial stage circuit 1 outputs internal clock ICK by delaying external clock ECK by a predetermined time as illustrated in FIG. 4. Initial stage circuit 2 receives the high clock enable signal CKE and outputs a high level signal S1. When in the disabled state, initial stage circuit 3 outputs a high level signal S2.

A refresh entry command is executed at time t3. This is done by providing clock enable signal CKE, row address strobe signal /RAS, column address strobe signal /CAS, and chip select signal /CS at a low level and write enable signal /WE at a high level at the rising edge of external clock ECK at time t3. Refresh command decision circuit 4 receives the refresh entry command and generates a refresh command signal RC having a high level in synchronism with internal clock ICK.

When clock enable signal CKE goes low, initial stage circuit 2 outputs signal S1 having a low level. After subsequent high and low transitions of internal clock ICLK, signal S1 propagates through D-type flip-flop 7 and D-type latch 8 to provide a signal S4 having a high level at time t4. With refresh command signal RC high and signal S4 high, NAND gate 9 provides a low signal S3 and inverter 6 provides self refresh status latch signal SRS having a high level after time t4.

With self refresh status latch signal SRS high, initial stage circuits (1 and 2) are disabled and initial stage circuit 3 is enabled. In this way, initial stage circuit 1 outputs internal clock ICK fixed at a high level regardless of the logic level of external clock ECK. Likewise, initial state circuit 2 outputs signal S1 having a low level. Because at this time clock enable signal CKE is kept low, initial stage circuit 3 provides signal S2 having a high level. By keeping ICLK high, self refresh mode decision circuit 5 keeps data latched in internal D-type flip-flop 7 and D-type latch 8 is not modified and the self refresh mode remains set. Thus, signal S4 is kept at the high level. Also, by keeping internal clock ICLK high, refresh command decision circuit 4 does not identify further applied commands and refresh command signal RC remains high as illustrated in FIG. 4.

Then, at around time t7, clock enable signal CKE transitions high. With clock enable signal CKE high, initial stage circuit 3 outputs signal S2 at a low level irrespective of the rising edge of external clock ECK. When signal S2 goes low, D-type latch 8 is reset to provide a high output and to cause signal S4 to go low. With signal S4 low, NAND gate 9 outputs signal S3 having a high level and inverter 6 outputs self refresh latch signal SRS having a low level. With self refresh latch signal SRS low, initial stage circuits (1 and 2) are enabled and initial stage circuit 3 is disabled. Thus, initial stage circuit 1 again generates internal clock ICK which is based on the external clock ECK delayed by a predetermined amount. Also, initial stage circuit 2 again outputs signal S2 having a high level in response to clock enable signal CKE having a high level.

In the same manner, refresh command decision circuit receives the signal S2 and is reset when signal S2 transitions low. Thus, refresh command signal RC transitions low at time t7 as illustrated in FIG. 4. In this way, the self refresh mode is exited.

In accordance with the example illustrated in FIGS. 3 and 4, when the mode of operation is set to the self refresh mode, initial circuits (1 and 2) are disabled. With initial circuits (1 and 2) disabled, their current consumption can be essentially zero. However, initial stage circuit 3 is enabled to provide a signal path to externally exit the self refresh mode. Initial stage circuit 3 is a complementary type input buffer. Thus, when clock enable signal CKE is provided having a sufficient voltage/logic level, such as a CMOS level of zero volts, the static current consumed by initial stage circuit 3 can be made to be essentially zero. In this way, the static current consumed by initial stage circuits (1 to 3) during the self refresh mode of operation can be essentially 0 mA.

In the conventional semiconductor memory device as described above, self refresh latch signal SRS changes to the low logic level to exit the self refresh mode in response to changing clock enable signal CKE from the low level to the high level.

The conventional semiconductor memory device illustrated in FIG. 3 can be susceptible to noise causing an erroneous logic level from clock enable signal CKE to be received by initial stage circuit 3. For example, as illustrated in FIG. 4 between times t5 and t6, a noise spike a is shown on clock enable signal CKE. If the noise spike a exceeds the threshold of the complementary input buffer within initial stage circuit 3, an unwanted logic transition may occur on signal S2. When such a noise spike is received after receiving the self refresh mode entry command, the self refresh mode may be erroneously exited. Such a situation may be caused, for example, just after the self refresh mode is set and a power supply in the system is interrupted in order to reduce system power consumption. This power supply interruption may cause noise on a device, such as a memory controller, supplying the clock enable signal CKE to the conventional semiconductor memory device.

Japanese Laid-Open Patent Publication No. Hei-10-125059, addresses this problem by disclosing a refresh mode having a refresh mode exit command. By using the refresh mode exit command the influence of the above-mentioned noise may be eliminated.

However, in Hei-10-125059, the setting and exiting (releasing) of the self refresh mode both executed with clock enable signal CKE in synchronism with external clock signal ECK. Accordingly, it is necessary to keep the initial stage circuit that generates internal clock ICK enabled during the operation of the self refresh mode. Thus, power consumption during the operation of the self refresh mode may be problematic.

In light of the above discussion, it would be desirable to provide a semiconductor memory device that may include a self refresh mode that may not be erroneously exited (released) due to the influence of noise or the like. It would also be desirable to provide the self refresh mode having a reduced power consumption.

SUMMARY OF THE INVENTION

A semiconductor memory device having a self refresh mode is disclosed. The self refresh mode may be entered in response to a self refresh set command and may be released in response to a self refresh release command. The self refresh release command may include a plurality of self refresh release commands sequentially executed while a clock enable signal is in a clock enable state. In this way, noise on a clock enable signal may not erroneously release the self refresh mode and the reliability of the self refresh mode may be improved.

According to one aspect of the embodiments, a semiconductor memory device may include a refresh operation entered upon the receipt of a refresh set command. The refresh operation may be released upon the receipt of a refresh release command wherein the release command may be executed over at least two cycles.

According to another aspect of the embodiments, the semiconductor memory device may be a synchronous dynamic random access memory and the at least two cycles may be two cycles of an external clock.

According to another aspect of the embodiments, the at least two cycles may be consecutive cycles of the external clock.

According to another aspect of the embodiments, the refresh release command includes a first refresh release command executed during a first cycle of the at least two cycles and a second refresh release command executed during a second cycle of the at least two cycles. The first refresh release command may include receiving a plurality of control signals having a first predetermined logic combination and the second refresh release command may include receiving the plurality of control signals having the first predetermined logic combination.

According to another aspect of the embodiments, the refresh release command include a first refresh release command executed during a first cycle of the at least two cycles and a second refresh release command executed during a second cycle of the at least two cycles. The first refresh release command may include receiving a plurality of control signals having a first predetermined logic combination and the second refresh release command may include receiving the plurality of control signals having a second predetermined logic combination.

According to another aspect of the embodiments, a first command decoder may be coupled to receive a plurality of external control signals and may generate a refresh set command signal based on the receipt of the refresh set command. A second command decoder may be coupled to receive a plurality of external control signals and may generate a refresh release command signal based on the receipt of the refresh release command.

According to another aspect of the embodiments, a semiconductor memory device may include a set signal output circuit coupled to receive a plurality of input signals. The set signal output circuit may provide a set signal that may set the operation of the semiconductor memory device to a refresh mode based on the plurality of input signals indicating a refresh set command. A release signal output circuit may be coupled to receive the plurality of input signals. The release signal output circuit may provide a release signal that releases the refresh mode based on the plurality of input signals indicating a refresh release command. The refresh release command may include a first refresh release command and a second refresh release command and the second refresh release command may be received after the first refresh release command. A status latch signal output circuit may be coupled to receive the set signal and the release signal. The status latch signal output circuit may provide a status latch signal indicating a refresh mode state. The refresh mode state may be set in response to the set signal and the refresh mode may be released in response to the reset signal. An enable circuit may be coupled to receive a clock enable signal and may provide an enable signal having a clock enable logic level and a clock disable logic level and may enable an internal clock to be generated based on an external clock when at the clock enable logic level. The release signal output circuit may be coupled to receive the clock enable signal and may be enabled to provide the release signal when the enable signal is at the clock enable logic level.

According to another aspect of the embodiments, the plurality of input signals may be any of a row address strobe signal, a column address strobe signal, a write enable signal, a chip select signal, addresses and data.

According to another aspect of the embodiments, the input signals may have a first logic combination indicating the refresh set command and a second logic combination indicating the first refresh release command.

According to another aspect of the embodiments, the enable circuit may be enabled when the status latch signal indicates the refresh mode state is set.

According to another aspect of the embodiments, the enable circuit may include a complementary logic gate input buffer.

According to another aspect of the embodiments, the status latch signal output circuit may include a reset-set (RS) flip-flop set in response to the set signal and reset in response to the release signal.

According to another aspect of the embodiments, the semiconductor memory device may be a dynamic random access memory and the refresh mode may be a self refresh mode.

According to another aspect of the embodiments, a semiconductor memory device may include a clock generator circuit coupled to receive an external clock and providing an internal clock. A set signal output circuit may be coupled to receive a plurality of input signals. The set signal output circuit may provide a set signal that may set the operation of the semiconductor memory device to a refresh mode based on the plurality of input signals received in synchronism with the internal clock indicating a refresh set command. A release signal output circuit may be coupled to receive the plurality of input signals. The release signal output circuit may provide a release signal that releases the refresh mode based on the plurality of input signals in synchronism with the internal clock indicating a refresh release command. The refresh release command may include a first refresh release command and a second refresh release command and the second refresh release command may be received after the first refresh release command. A status latch signal output circuit may be coupled to receive the set signal and the release signal. The status latch signal output circuit may provide a status latch signal indicating a refresh mode state. The refresh mode state may be set in response to the set signal and the refresh mode may be released in response to the reset signal. An enable circuit may be coupled to receive a clock enable signal and may provide an enable signal having a clock enable logic level and a clock disable logic level and may enable the internal clock to be generated based on an external clock when at the clock enable logic level. The release signal output circuit may be coupled to receive the clock enable signal and may be enabled to provide the release signal when the enable signal is at the clock enable logic level.

According to another aspect of the embodiments, the clock generator circuit may be disabled when the enable signal is in the clock disable logic level and the status latch signal indicates the refresh mode.

According to another aspect of the embodiments, the set signal output circuit may provide the set signal in synchronism with the internal clock and the release signal output circuit may provide the release signal in synchronism with the internal clock.

According to another aspect of the embodiments, the input signals may have a first logic combination indicating the refresh set command and a second logic combination indicating the first refresh release command.

According to another aspect of the embodiments, the enable circuit may be enabled when the status latch signal indicates the refresh mode state.

According to another aspect of the embodiments, the set signal output circuit and release signal output circuit may be coupled to receive a second internal clock based on the internal clock when the enable signal is in the clock enable logic level.

According to another aspect of the embodiments, the release signal output circuit may include n (n is a natural number) flip-flops and n logic circuits. Each logic circuit may be coupled to receive the plurality of input signals. Each one of the n logic circuits may provide an output coupled to an input of a respective one of the n flip flops which may be latched synchronously with the internal clock. The first flip-flop may provide an output coupled to an input of the second logic circuit and the (n-1) flip-flop may provide an output coupled to an input of the $n^{th}$ flip-flop. The output of the $n^{th}$ flip-flop may be coupled to provide the release signal.

DETAILED DESCRIPTION OF THE EMBODIMENTS

Various embodiments of the present invention will now be described in detail with reference to a number of drawings.

Figure 1:
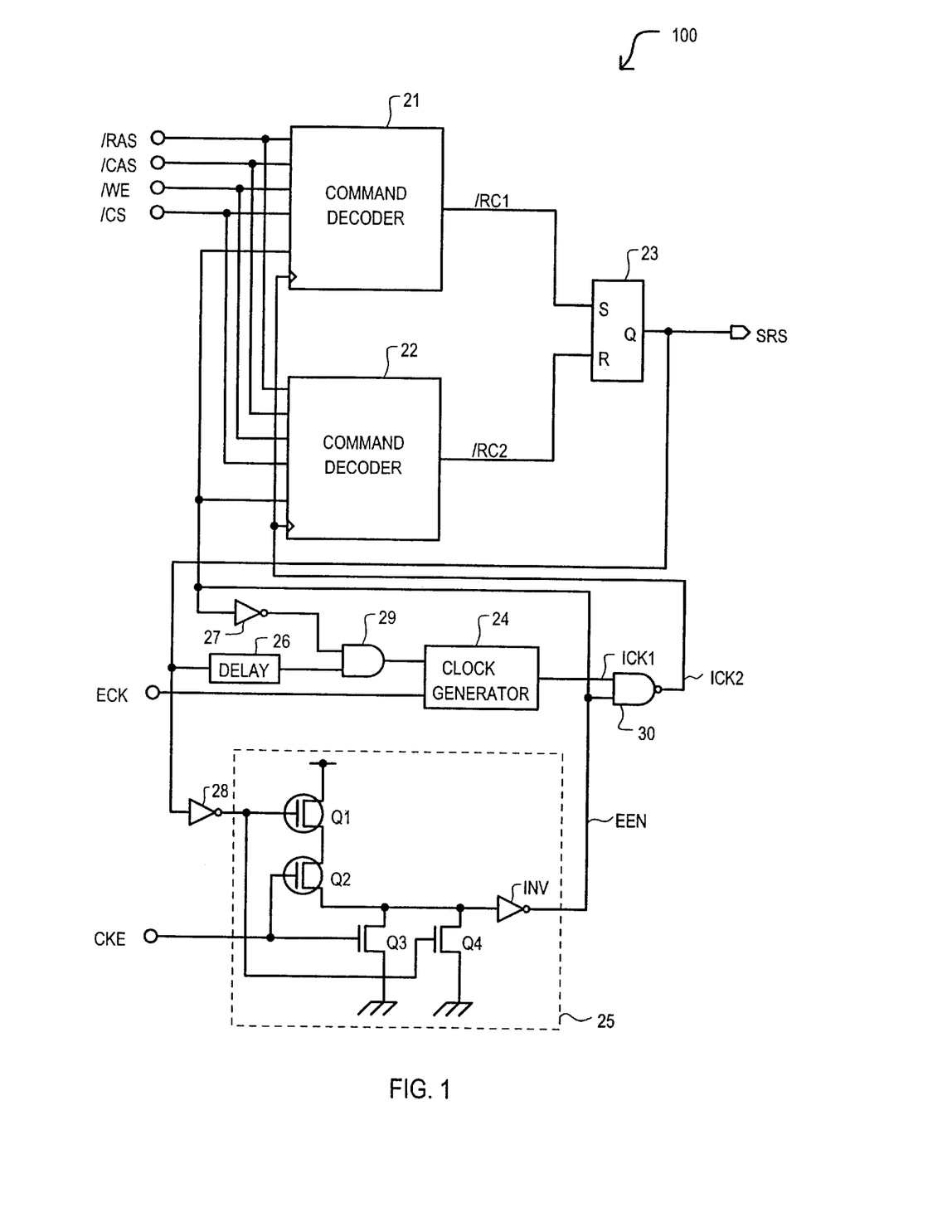
FIG. 1 is a circuit schematic diagram of a main portion of a semiconductor memory device according to an embodiment.

Referring now to FIG. 1, a circuit schematic diagram of a main portion of a semiconductor memory device according to an embodiment is set forth and given the general reference character 100. The main portion of a semiconductor memory device 100 may be included in a synchronous dynamic random access memory (SDRAM), as just one example.

The main portion of a semiconductor memory device 100 may include command decoders (21 and 22), RS flip-flop 23, clock generator circuit 24, enable circuit 25, delay circuit 26, inverters (27 and 28), AND gate 29, and NAND gate 30.

Main portion of a semiconductor memory device 100 may receive row address strobe signal /RAS, column address strobe signal /CAS, write enable signal /WE, chip select signal /CS, external clock ECK, and clock enable signal CKE and may generate a self refresh state latch signal SRS.

Command decoder 21 may receive row address strobe signal /RAS, column address strobe signal /CAS, write enable signal /WE, chip select signal /CS, a self refresh release enable signal EEN, and an internal clock ICK2 and may generate a self refresh set command signal /RC1. Command decoder 22 may receive row address strobe signal /RAS, column address strobe signal /CAS, write enable signal /WE, chip select signal /CS, a self refresh release enable signal EEN, and an internal clock ICK2 and may generate a self refresh release command signal /RC2.

RS flip-flop may receive self refresh set command signal /RC1 and self refresh release command signal /RC2 and may provide self refresh state latch signal SRS.

Inverter 27 may receive self refresh release enable signal EEN and may provide an output to an input of AND 29. Delay circuit 26 may receive self refresh state latch signal SRS and may provide an output to another input of AND 29. AND 29 may provide an output to an input of clock generator 24. Clock generator may receive external clock ECK at another input and may provide internal clock ICK1 to an input of NAND gate 30. NAND gate 30 may receive self refresh release enable signal EEN at another input and may provide internal clock ICK2. Inverter 28 may receive self refresh state latch signal SRS and may provide an output as an input to enable circuit 25. Enable circuit 25 may receive clock enable signal CKE at another input and may provide self refresh release enable signal EEN.

Command decoder 21 may be enabled when self refresh release enable signal EEN is at a high logic level. When enabled, command decoder 21 may latch and decode row address strobe signal /RAS, column address strobe signal /CAS, write enable signal /WE, and chip select signal /CS in synchronism with the rising edge of internal clock ICK2. When row address strobe signal /RAS is low, column address strobe signal /CAS is low, write enable signal /WE is high, and chip select signal /CS is low, command decoder 21 may generate self refresh set command signal /RC1 having a low level at the rising edge of the next cycle of internal clock ICK2. Self refresh command set signal /RC1 having a low level may indicate a self refresh entry or set command has been received.

Row address strobe signal /RAS, column address strobe signal /CAS, write enable signal /WE, chip select signal /CS, and self refresh set command signal /RC1 may be active low. Prefix "/" may indicate negative logic.

Command decoder 22 may be enabled when self refresh release enable signal EEN is at a high logic level. When enabled, command decoder 22 may latch and decode row address strobe signal /RAS, column address strobe signal /CAS, write enable signal /WE, and chip select signal /CS in synchronism with the rising edge of internal clock ICK2. When row address strobe signal /RAS is high, column address strobe signal /CAS is high, write enable signal /WE is high, and chip select signal /CS is low for three consecutive cycles, command decoder 21 may generate self refresh release command signal /RC2 having a low level at the rising edge of the next cycle of internal clock ICK2. Self refresh release command signal /RC2 having a low level may indicate a self refresh exit or release command has been received. Self refresh release command signal /RC2 may be an active low signal.

RS flip-flop 23 may set and output self refresh state signal SRS having a high level when a low level self refresh set command signal /RC1 is received. When a self refresh release command signal /RC2 having a low level is received, RS flip-flop 23 may be reset and may output a self refresh status latch signal SRS having a low level.

Clock generator circuit 24 may be disabled when AND gate 29 outputs a high level signal. AND gate 29 may output a high level signal when self refresh release enable signal EEN is at a low level and when self refresh status latch signal SRS delayed by delay circuit 26 is at a high level. Delay circuit 26 may delay self refresh status latch signal SRS by a predetermined time.

Clock generator circuit 24 may be enabled when AND gate 29 outputs a low level signal. When enabled, clock generator circuit 24 may output internal clock ICK1 based on external clock ECK. Internal clock ICK1 may have an opposite phase to external clock ECK. External clock ECK may be a reference clock for a system including the semiconductor memory device.

NAND gate 30 may be enabled when self refresh release enable signal EEN is at a high level. When enabled, NAND gate 30 may output internal clock ICK2. Internal clock ICK2 may be opposite in phase to internal clock ICK1. Command decoders (21 and 22) and other circuits (not shown) in the semiconductor memory device may receive internal clock ICK2. The output of AND gate 29 may be supplied to other initial stage circuits (not shown) as an enable signal.

Enable circuit 25 may include p-type IGFETs (insulated gate field effect transistors) (Q1 and Q2), n-type IGFETs (Q3 and Q4), and inverter INV. P-type IGFET Q1 may have a source connected to a power supply voltage VDD, a gate connected to receive the output of inverter 28, and a drain connected to the source of p-type IGFET Q2. P-type IGFET Q2 may have a gate connected to receive clock enable signal CKE and a drain connected to the input of inverter INV. N-type IGFET Q3 may have a source connected to ground, a gate connected to receive clock enable signal CKE, and a drain connected to the input of inverter INV. N-type IGFET Q4 may have a source connected to ground, a gate connected to the output of inverter 28, and a drain connected to the input of inverter INV. Inverter INV may provide self refresh release enable signal EEN as an output.

P-type IGFETs (Q1 and Q2) and n-type IGFETs (Q3 and Q4) may collectively comprise a 2-input NOR gate. Clock enable signal CKE may be applied to enable circuit 25 for determining whether or not external clock ECK may be used to generate internal clock ICK2.

Enable circuit 25 may be enabled when the output of inverter 28 is low (i.e. self refresh status latch signal SRS is high). When enabled, enable circuit 25 may detect the logic level of clock enable signal CKE and may generate a self refresh release enable signal EEN having the same logic level as clock enable signal CKE.

The operation of the main portion of semiconductor memory device 100 will be described with reference to the timing diagram illustrated in FIG. 2.

Figure 2:
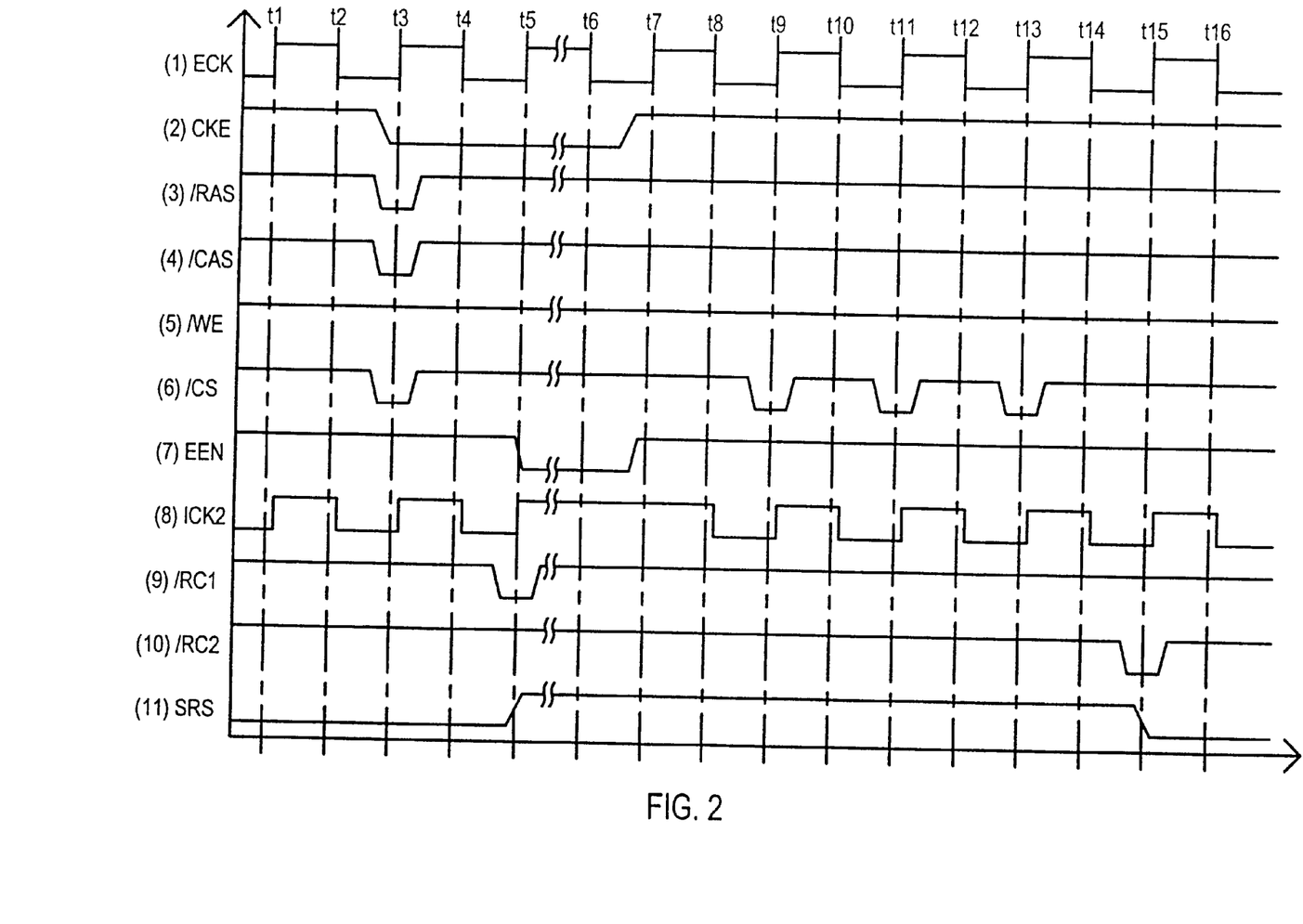
FIG. 2 is a timing diagram illustrating the operation of the main portion of the semiconductor memory device of FIG. 1.

FIG. 2 is a timing diagram illustrating the operation of the main portion of semiconductor memory device 100. The timing diagram of FIG. 2 can include external clock ECK, clock enable signal CKE, row address strobe signal /RAS, column address strobe signal /CAS, write enable signal /WE, chip select signal /CS, self refresh release enable signal EEN, internal clock ICK2, self refresh set command signal /RC1, self refresh release command signal IRC2, and self refresh status latch signal SRS.

As illustrated in FIG. 2, clock enable signal CKE may be initially high before time t1 and may transition low at time t3. Also, because a self refresh entry or exit command has not been received, self refresh set command signal /RC1 and self refresh release command signal /RC2 may initially both be high. Thus, self refresh status latch signal SRS may initially be low.

With self refresh status latch signal SRS low, the output of inverter 28 may be high. In this way, enable circuit 25 may be disabled because p-type IGFET Q1 may be turned off and n-type IGFET Q4 may be turned on. Accordingly, self refresh release enable signal EEN may initially be high as illustrated in FIG. 2, regardless of the level of clock enable signal CKE. Because self refresh status latch signal SRS is low and self refresh release enable signal EEN is high, the output of AND gate 29 may be low. With the output of AND gate 29 low, clock generator circuit 24 may be enabled. Thus, clock generator circuit 24 may delay external clock ECK by a predetermined time and may output internal clock ICK1 having an opposite phase to external clock ECK. With self refresh release enable signal EEN high, NAND gate 30 may be enabled and may output internal clock ICK2 in opposite phase to internal clock ICK1. Command decoders (21 and 22) and other circuits (not shown) in the semiconductor memory device may receive internal clock ICK2. Also, other initial stage circuits (not shown), which may receive the output of AND gate 29 as an enable signal, may be enabled.

Subsequently, at time t3, at the rising edge of external clock ECK, row address strobe signal /RAS may be low, column address strobe signal /CAS may be low, write enable signal /WE may be high, and chip select signal /CS may be low indicating a self refresh entry or set command. With self refresh release enable signal EEN high at this time, command decoder 21 may be enabled to receive the self refresh entry or set command with the rising edge of internal clock ICK2. Then, command decoder 21 may output self refresh set command signal /RC1 having a low level on the rising edge of the next internal clock ICK2 as illustrated in FIG. 2 at time t5. It is noted, that even if clock enable signal CKE transitions to a low level at time t3 as illustrated in FIG. 2, the output of inverter 28 (the complement of self refresh status latch signal SRS) may be high and enable circuit 25 may be disabled. In this way, during this time, self refresh enable signal EEN may be fixed to the high level as illustrated in FIG. 2.

Subsequently, because command decoder 21 outputs a refresh set command signal /RC1 having a low level at time t5 as previously described, RS flip flop 23 may set and output self refresh status latch signal SRS having a high level. In this way, the self refresh mode may be set. After the high level of refresh status latch signal SRS has propagated through the predetermined delay of delay circuit 26, AND gate 29 may output a high level. In this way, clock generator circuit 24 may be disabled. At the same time, the other initial stage circuits (not shown) that receive the output of AND gate 29 may be disabled and may not consume substantial power. When refresh status latch signal SRS transitions high at time t5, the output of inverter 28 (the complement of self refresh status latch signal SRS) may transition low. Thus, p-type IGFET Q1 in enable circuit 25 may be turned on and n-type IGFET Q4 may be turned off. In this way, enable circuit 25 may be enabled and may self refresh enable signal EEN may transition to a low level because clock enable signal CKE is low at this time. With self refresh enable signal EEN low, command decoders (21 and 22) and NAND gate 30 may be disabled. Thus, command decoders (21 and 22) may not process a received command and NAND gate 30 may output internal clock ICK2 fixed at a high level.

Then, for example around time t7 in FIG. 2, clock enable signal CKE may transition to the high level independently of the timing of external clock ECK. Accordingly, p-type IGFET Q2 of enable circuit 25 may be turned off and n-type IGFET Q4 may be turned on. In this way, self refresh release enable signal EEN may transition to the high level.

With self refresh release enable signal EEN high, command decoders (21 and 22) may be enabled. Also, AND gate 29 may output a low logic level to enable clock generator circuit 24. Clock generator circuit 24 may then delay external clock ECK by a predetermined time to output internal clock ICK1. Internal clock ICK1 may be in opposite phase to external clock ECK. With self refresh release enable signal CKE high, NAND gate 30 may be enabled. In this way, NAND gate 30 may output clock signal ICK2 in opposite phase to internal clock ICK1. In a similar fashion, other initial stage circuits (not shown) may receive and be enabled by the output of AND gate 29.

Beginning at time t9, three commands may be successively received in which row address strobe signal /RAS is high, column address strobe signal /CAS is high, write enable signal /WE is high, and chip select signal /CS is low (indicating a self refresh exit or release command). Command decoder 22 may synchronously latch and decode these commands with the rising edge of internal clock ICK2. Command decoder may then output a self refresh release command signal /RC2 having a low level at time t15. The low level of self refresh release command signal /RC2 may be output in synchronism with the next clock cycle after the last of the three successive commands indicating a self refresh exit or release command as illustrated in FIG. 2. With self refresh release command signal /RC2 low, RS flip-flop 23 may reset and self refresh status latch signal SRS may transition to the low level. In this way, the self refresh mode may be released or exited.

When self refresh status latch signal SRS transitions to the low level, delay circuit 26 may receive this transition, and after a predetermined delay time, may provide a low level output to the input of NAND gate 29. However, because self refresh release enable signal EEN is already high at this time, the output of inverter 27 may be low. Thus, clock generator circuit 25 may remain enabled and may continue to provide internal clock ICK1 by delaying external clock ECK by a predetermined time. Internal clock ICK1 may have a phase that is opposite to external clock ECK. With self refresh release enable signal EEN high, NAND gate 30 may be enabled and may provide internal clock ICK2 having a phase opposite to internal clock ICK1. Likewise, other initial stage circuits (not shown) which may receive the output of NAND gate 29 as an enable signal may remain enabled.

In accordance with the present embodiments after the self refresh mode is entered, unless three commands are successively received in which row address strobe signal /RAS is high, column address strobe signal /CAS is high, write enable signal /WE is high, and chip select signal /CS is low (indicating a self refresh exit or release command), command decoder 22 may be prevented from providing a low level refresh release command signal /RC2. Thus, the self refresh mode may not be exited or released.

Accordingly, although clock enable signal CKE supplied from the outside is at a low logic level, noise induced transitions received by enable circuit 25 after the self refresh mode is set may not affect the logic level of the self refresh status latch signal SRS and the self refresh mode may not be erroneously released. When enable circuit 25 does receive either a noise induced or other transition of clock enable signal CKE to the high level when in the self refresh mode, self refresh release enable signal EEN may transition high and clock generator circuit 24 and initial stage circuits (not shown) may be enabled. However, when the enable circuit 25 receives a low level clock enable signal CKE, self refresh release enable signal EEN may return low and clock generator circuit 24 and other initial stage circuits (not shown) may once again be disabled.

In accordance with the semiconductor memory device according to the embodiments, enable circuit 25 may include p-type IGFETs (Q1 and Q2) and n-type IGFETs (Q3 and Q4) having a complementary arrangement. In this case, a NAND gate may be formed. When an essentially full logic level (such as essentially VDD or VSS) signal is received as an input, enable circuit 25 may not have an appreciable static current consumption. Thus, enable circuit 25 may consume less static current than the differential amplifier type circuits as illustrated in initial stage circuits (1 and 2) in the conventional approach of FIG. 3. Also, current consumption for non-full logic levels and/or switching current may be reduced by adjusting the sizes of p-type IGFETs (Q1 and Q2) and n-type IGFETs (Q3 and Q4). P-type IGFETs (Q1 and Q2) and n-type IGFETs (Q3 and Q4) may be metal oxide semiconductor field effect transistors (MOSFETs), as just one example, and may be configured to form a complementary metal oxide semiconductor (CMOS) logic gate.

Also, clock generator circuit 24, as well as the other initial stage circuits (not shown) may be disabled when an enable signal (clock enable signal CKE) is non-active (low) and the status latch signal (self refresh status latch signal SRS) is active (high). In this way, device power consumption may be reduced during the self refresh mode.

In accordance with the semiconductor memory device according to the present embodiments, the self refresh mode may be prevented from being released or exited due to noise induced influences, etc. Thus, the self refresh operation may have an improved reliability and power consumption of the device during the self refresh mode may be reduced.

In the semiconductor memory device whose main portion is illustrated in FIG. 1, command decoder 21 is provided for setting self refresh state latch signal SRS and command decoder 22 is provided for resetting self refresh state latch signal SRS. These command decoders (21 and 22) may be enabled when self refresh release enable signal EEN at a high logic level is supplied thereto. However, another arrangement in which the command decoders may be enabled without self refresh release enable signal EEN.

Figure 5:
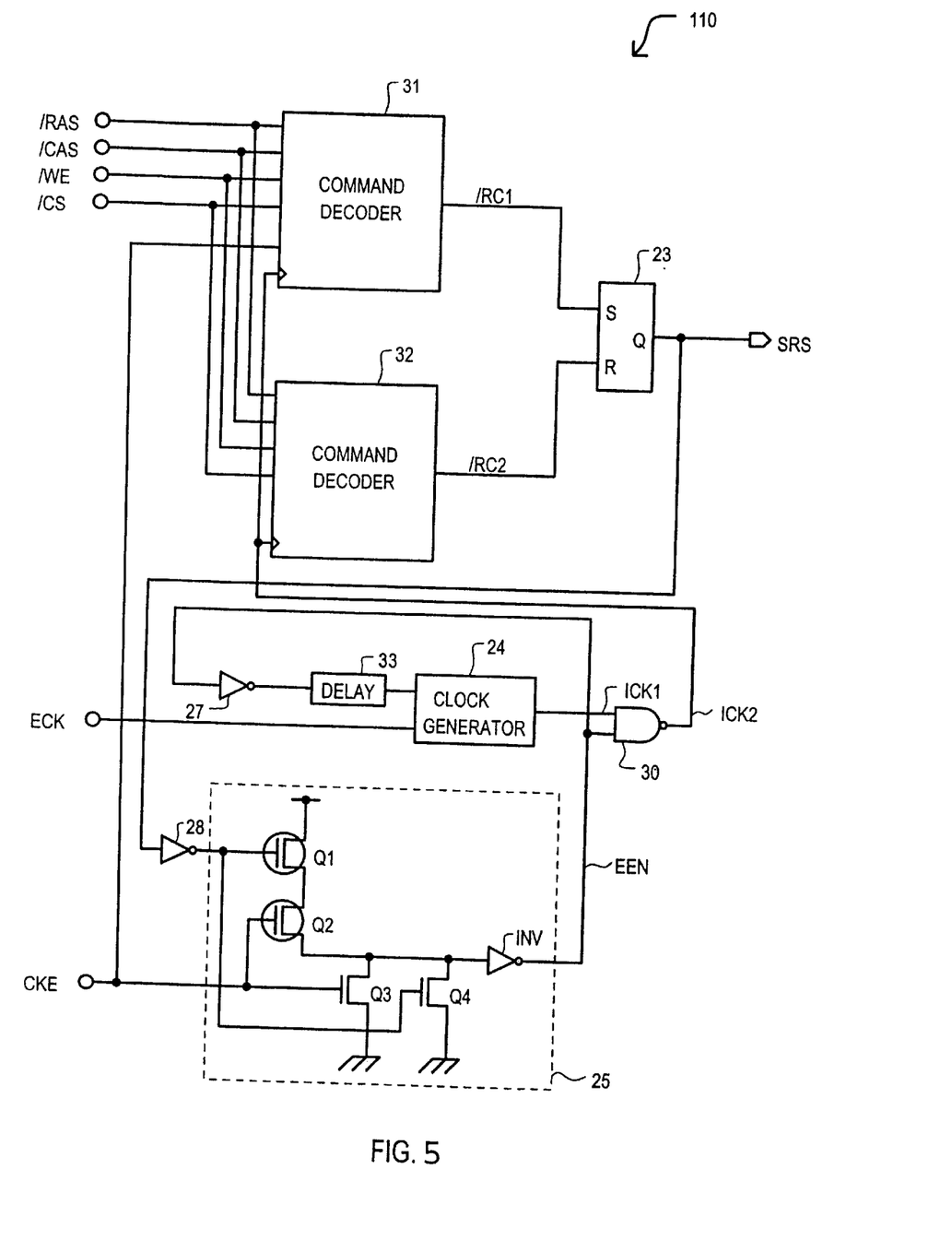
FIG. 5 is a circuit schematic diagram of a main portion of a semiconductor memory device according to another embodiment.

In FIG. 5, a circuit schematic diagram of a main portion of a semiconductor memory device according to another embodiment is set forth and given the general reference character 110. Although the main portion of a semiconductor memory device 110 shown in FIG. 5 is resemble to the circuit shown in FIG. 1, the difference of the main portion of a semiconductor memory device 110 from the circuit shown in FIG. 1 will described below.

The main portion of a semiconductor memory device 110 may include command decoders (31 and 32), RS flip-flop 23, clock generator circuit 24, enable circuit 25, delay circuit 33, inverters (27 and 28), and NAND gate 30. Clock enable signal CKE may be supplied to enable circuit 25 and, further supplied to command decoder 31, which is provided for setting self refresh state latch signal SRS, as an enable signal for this command decoder. Self refresh release enable signal EEN which is generated in enable circuit 25 is not supplied to command decoder 31. Internal structure of command decoder 31 may be identical to that of command decoder 21 shown in FIG. 1.

Another command decoder 32 which is provided for resetting self refresh state latch signal SRS may be identical to command decoder 22 shown in FIG. 1 except that this command decoder 32 does not receive self refresh release enable signal EEN and that it may be enabled and operate only with internal clock ICK2. Since command decoder 32 may be disabled when internal clock ICK2 is disabled, command decoder 32 will not operate during the operation of the self refresh mode. When internal clock ICK2 is interrupted during a sequence of commands for releasing the self refresh mode, command decoder 32 may be turned to the disable state thereby preventing the self refresh mode from being erroneously released or exited even if clock enable signal CKE is temporally enabled to generate internal clock ICK2 due to noise induced influence.

Self refresh release enable signal EEN may be supplied only to inverter 27 and NAND gate 30. An output of inverter 27 may be supplied to clock generator 24 via delay circuit 33. Clock generator 24 may receive external clock ECK in addition to the output of delay circuit 33. Those skilled in the art will easily understand the operation of the main portion of a semiconductor memory device 110.

It is understood that the embodiments described above are exemplary and the present invention should not be limited to those embodiments. Specific structures should not be limited to the described embodiments.

For example, in the embodiments, command decoders (21 and 22) may provide output signals (/RC1 and /RC2) in accordance with a combination of received control signals (/RAS, /CAS, /WE, and /CE), however, it is understood that any combination of control signals may be used to provide the self refresh entry (set) command or self refresh exit (release) command. Signals used to determine the command may include address, data, as well as control signals, as just a few examples. Any signals may be supplied to command decoders (21 and 22), in particular, signals supplied to command decoder 22 may provide a command that may not be susceptible to be detected from noise induced fluctuations.

Although in the embodiments, command decoders (21 and 22) may sample or latch, received command signals and/or generate internal command signals in synchronism with the rising edge of internal clock ICK2, the present invention is not limited as such. For example, command decoders (21 and 22) may be adapted to sample or latch, received command signals and/or generate internal command signals in synchronism with a falling edge of internal clock ICK2 or even irrespective to internal clock ICK2. Likewise, command decoders (21 and 22) may be adapted to sample or latch, received command signals and/or generate internal command signals in synchronism with both the rising and falling edges of internal clock ICK2, as just a few examples. Furthermore, the signals received and/or generated by circuits illustrated in FIG. 1 may be active high or active low, respectively.

Although, an example was disclosed in which the self refresh exit (release) command was determined by the same combination of the same signals successively provided in three cycles to command decoder 22, the invention should not be limited as such. The number of cycles may be two, four, five, or more and may include cycles interposed between, as just a few examples. The combination of signals may be different for each cycle.

Command decoder 22 may be constructed as described below. Command decoder 22 may include 3 D-type flip flops, 3 multi-input NAND gates, and a plurality of inverters. A plurality of inverters may be selectively provided to decode the externally received command signals (such as /RAS, /CAS, /WE, and /CS), and provide outputs to NAND gate in accordance with the logic level of the respective command signal for providing the self refresh exit command. The first NAND gate may provide an output to the first D-type flip-flop, which may be latched in synchronism with internal clock ICK2. The output of the first D-type flip-flop may be provided to the second NAND gate as an enable signal to indicate that the second cycle of the self refresh exit command is to be received. Likewise, the output of the second NAND gate may be provided to a second D-type flip-flop. The output of the second D-type flip-flop may be provided to the third NAND gate as an enable signal to indicate that the third cycle of the self refresh exit command is to be received. Likewise, the output of the third NAND gate may be provided to a third D-type flip-flop. The third D-type flip-flop may provide the self refresh release command signal /RC2. Respective inverters and corresponding NAND gates may be a logic circuit. As such, the number of logic circuits and NAND gates may correspond to the number of commands required to generate the self refresh exit (release) command.

Although in the embodiments, self refresh status latch signal SRS may be output from RS flip-flop 23, as just an example, the present invention may not be limited as such. Any circuit may be used which may generate an active self refresh status latch signal SRS when the self refresh mode is set and generates a non-active self refresh status latch signal SRS upon the releasing or exiting of the self refresh mode.

The self refresh mode may include refresh operations internally generated by a dynamic random access memory. A timing device, such as an oscillator may be used to periodically refresh rows of memory cells during the self refresh mode. During the self refresh mode, external access to the memory cells may not be permitted, as just a few examples.

Although in the embodiments, no particular description was provided for the clock generator circuit 24, initial stage circuits, similar to initial stage circuits (1 and 2) illustrated in FIG. 3 may be included. Likewise, logic levels may be inverted to produce an internal clock signal that may have a complementary phase to the externally provided clock signal.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
a refresh operation entered upon the receipt of a refresh set command; and
the refresh operation released upon the receipt of a refresh release command wherein the refresh release command is executed over at least two cycles.

2. The semiconductor memory device according to claim 1, wherein:
the semiconductor memory device is a synchronous dynamic random access memory and the at least two cycles are two cycles of an external clock.

3. The semiconductor memory device according to claim 2, wherein:
the at least two cycles are consecutive cycles of the external clock.

4. The semiconductor memory device according to claim 1, wherein:
the refresh release command includes a first refresh release command executed during a first cycle of the at least two cycles and a second refresh release command executed during a second cycle of the at least two cycles; and
the first refresh release command includes receiving a plurality of control signals having a first predetermined logic combination and the second refresh release command includes receiving the plurality of control signals having the first predetermined logic combination.

5. The semiconductor memory device according to claim 1, wherein:
the refresh release command includes a first refresh release command executed during a first cycle of the at least two cycles and a second refresh release command executed during a second cycle of the at least two cycles; and
the first refresh release command includes receiving a plurality of control signals having a first predetermined logic combination and the second refresh release command includes receiving the plurality of control signals having a second predetermined logic combination.

6. The semiconductor memory device according to claim 1, further including:
a first command decoder coupled to receive a plurality of external control signals and generate a refresh set command signal based on the receipt of the refresh set command; and
a second command decoder coupled to receive a plurality of external control signals and generate a refresh release command signal based on the receipt of the refresh release command.

7. A semiconductor memory device, comprising:
a set signal output circuit coupled to receive a plurality of input signals and providing a set signal that sets the operation of the semiconductor memory device to a refresh mode based on at least one of the plurality of input signals indicating a refresh set command;
a release signal output circuit coupled to receive the plurality of input signals and providing a release signal that releases the refresh mode based on at least one of the plurality of input signals indicating a refresh release command wherein the refresh release command includes a first refresh release command and a second refresh release command and the second refresh release command is received after the first refresh release command;

a status latch signal output circuit coupled to receive the set signal and the release signal and providing a status latch signal indicating a refresh mode wherein the refresh mode is set in response to the set signal and the refresh mode is released in response to the release signal; and an enable circuit coupled to receive a clock enable signal and providing an enable signal having a clock enable logic level and a clock disable logic level and enables an internal clock to be generated based on an external clock when at the, clock enable logic level wherein the release signal output circuit is coupled to receive the clock enable signal and is enabled to provide the release signal when the enable signal is at the clock enable logic level.

8. The semiconductor memory device of claim 7, wherein:

the plurality of input signals includes any of the group consisting of a row address strobe signal, a column address strobe signal, a write enable signal, a chip select signal, addresses and data.

9. The semiconductor memory device of claim 7, wherein:

the plurality of input signals have a first logic combination indicating the refresh set command and a second logic combination indicating the first refresh release command.

10. The semiconductor memory device of claim 7, including:

the enable circuit is enabled when the status latch signal indicates the refresh mode is set.

11. The semiconductor memory device of claim 7, wherein:

the enable circuit includes a complementary logic gate input buffer.

12. The semiconductor memory device of claim 7, wherein:

the status latch signal output circuit includes a RS flip-flop set in response to the set signal and reset in response to the release signal.

13. The semiconductor memory device of claim 7, wherein:

the semiconductor memory device is a dynamic random access memory and the refresh mode is a self refresh mode.

14. A semiconductor memory device, comprising:

a clock generator circuit coupled to receive an external clock and providing an internal clock;

a set signal output circuit coupled to receive a plurality of input signals and providing a set signal that sets the operation of the semiconductor memory device to a refresh mode based on the plurality of input signals received in synchronism with the internal clock and indicating a refresh set command;

a release signal output circuit coupled to receive at least one of the plurality of input signals and providing a release signal that releases the refresh mode based on the at least one of the plurality of input signals received in synchronism with the internal clock and indicating a refresh release command wherein the refresh release command includes a first refresh release command and a second refresh release command and the second refresh release command is received after the first refresh release command;

a status latch signal output circuit coupled to receive the set signal and the release signal and providing a status latch signal indicating a refresh mode wherein the refresh mode is set in response to the set signal and the refresh mode is released in response to the release signal; and an enable circuit coupled to receive a clock enable signal and providing an enable signal having a clock enable logic level and a clock disable logic level and enables the internal clock to be generated based on an external clock when at the clock enable logic level wherein the release signal output circuit is coupled to receive the clock enable signal and is enabled to provide the release signal when the enable signal is at the clock enable logic level.

15. The semiconductor memory device of claim 14, wherein:

the clock generator circuit is disabled when the enable signal is in the clock disable logic level and the status latch signal indicates the refresh mode.

16. The semiconductor memory device of claim 14, wherein:

the set signal output circuit provides the set signal in synchronism with the internal clock and the release signal output circuit provides the release signal in synchronism with the internal clock.

17. The semiconductor memory device of claim 14, wherein:

the input signals have a first logic combination indicating the refresh set command and a second logic combination indicating the first refresh release command.

18. The semiconductor memory device of claim 14, wherein:

the enable circuit is enabled when t he status latch signal indicates the refresh mode.

19. The semiconductor memory device of claim 14, wherein:

the set signal output circuit and release signal output circuit are coupled to receive a second internal clock based on the internal clock when the enable signal is in the clock enable logic level.

20. The semiconductor memory device of claim 14, wherein, wherein:

the release signal output circuit includes n (n is a natural number) flip-flops and n logic circuits, each logic circuit is coupled to receive the plurality of input signals, each one of the n logic circuits provides an output coupled to an input of a respective one of the n flip-flops which is latched synchronously with the internal clock;

the first flip-flop provides an output coupled to an input of the second logic circuit and the (n-1) flip-flop provides an output coupled to an input of the $n^{th}$ flip-flop; and the output of the $n^{th}$ flip-flop is coupled to provide the release signal.

* * * * *